(12) United States Patent
Plaisted et al.

(10) Patent No.: US 10,138,544 B2
(45) Date of Patent: Nov. 27, 2018

(54) SPUTTERING TARGET

(75) Inventors: Dean T. Plaisted, Kennebunk, ME (US); Michael Asbas, Alfred, ME (US); Lawrence C. Ferrin, Lebanon, ME (US); Paul G. Carter, East Waterboro, ME (US); Guy P. Laverriere, Biddeford, ME (US)

(73) Assignee: SOLERAS, LTD., Biddeford, ME (US)

(*) Notice: Subject to any disclaimer, the term of this patent is extended or adjusted under 35 U.S.C. 154(b) by 564 days.

(21) Appl. No.: 14/127,759

(22) PCT Filed: Jun. 27, 2012

(86) PCT No.: PCT/US2012/044399
§ 371 (c)(1),
(2), (4) Date: Mar. 27, 2014

(87) PCT Pub. No.: WO2013/003458
PCT Pub. Date: Jan. 3, 2013

(65) Prior Publication Data
US 2014/0202852 A1    Jul. 24, 2014

Related U.S. Application Data

(60) Provisional application No. 61/501,605, filed on Jun. 27, 2011.

(51) Int. Cl.
*B22D 7/00* (2006.01)
*B22D 7/06* (2006.01)
(Continued)

(52) U.S. Cl.
CPC .......... *C23C 14/3414* (2013.01); *B22D 7/005* (2013.01); *B22D 7/06* (2013.01); *B22D 25/06* (2013.01)

(58) Field of Classification Search
CPC .......... B22D 7/005; B22D 7/06; B22D 19/00; B22D 19/16; B22D 25/06
(Continued)

(56) References Cited

U.S. PATENT DOCUMENTS 4,966,676 A    10/1990  Fukasawa et al.
5,066,381 A    11/1991  Ohta et al.
(Continued)

FOREIGN PATENT DOCUMENTS

DE    2427098 B1    9/1975
DE    3532131 A1    3/1987
(Continued)

OTHER PUBLICATIONS

International Preliminary Report on Patentability dated Oct. 11, 2013 in International Application No. PCT/US2012/044399 (13 pages).
(Continued)

*Primary Examiner* — Kevin P Kerns
(74) *Attorney, Agent, or Firm* — Workman Nydegger

(57) ABSTRACT

A method for casting a reactive material PVD target, as well as targets thus obtained and a mold for casting. The method includes providing a mold defining an opening, placing a reactive material ingot in¬ to a reservoir (140) proximate the mold, forming a vacuum and melting the reactive material in the reservoir, heating the mold to above a casting temperature and forming a vacuum therein, introducing molten reactive material from the reservoir into the opening and cooling the mold to form the PVD target.

16 Claims, 4 Drawing Sheets

(51) Int. Cl.
*B22D 25/06* (2006.01)
*C23C 14/34* (2006.01)

(58) Field of Classification Search
USPC .............................. 164/61, 66.1, 71.1, 112
See application file for complete search history.

(56) References Cited

U.S. PATENT DOCUMENTS

| | | | |
|---|---|---|---|
| 5,096,562 A | 3/1992 | Boozenny et al. | |
| 5,171,411 A * | 12/1992 | Hillendahl | C23C 14/3414 |
| | | | 204/192.12 |
| 5,215,639 A | 6/1993 | Boys | |
| 5,230,459 A | 7/1993 | Mueller et al. | |
| 5,435,965 A | 7/1995 | Mashima et al. | |
| 5,474,667 A | 12/1995 | Hurwitt et al. | |
| 5,487,822 A | 1/1996 | Demaray et al. | |
| 5,591,314 A | 1/1997 | Morgan et al. | |
| 5,676,803 A | 10/1997 | Demaray et al. | |
| 5,693,203 A | 12/1997 | Ohhashi et al. | |
| 5,836,506 A | 11/1998 | Hunt et al. | |
| 5,963,778 A | 10/1999 | Stellrecht | |
| 6,039,850 A | 3/2000 | Schulz | |
| 6,071,389 A | 6/2000 | Zhang | |
| 6,085,966 A | 7/2000 | Shimomuki et al. | |
| 6,164,519 A | 12/2000 | Gilman et al. | |
| 6,183,613 B1 | 2/2001 | Gilman et al. | |
| 6,183,686 B1 | 2/2001 | Bardus et al. | |
| 6,190,516 B1 | 2/2001 | Xiong et al. | |
| 6,192,969 B1 | 2/2001 | Bunn et al. | |
| 6,287,435 B1 | 9/2001 | Drewery et al. | |
| 6,409,897 B1 | 6/2002 | Wingo | |
| 6,419,806 B1 | 7/2002 | Holcomb et al. | |
| 6,451,185 B2 | 9/2002 | Beier et al. | |
| 6,579,431 B1 | 6/2003 | Bolcavage et al. | |
| 6,599,405 B2 | 7/2003 | Hunt et al. | |
| 6,619,537 B1 | 9/2003 | Zhang et al. | |
| 6,640,876 B2 | 11/2003 | Yajima et al. | |
| 6,645,358 B2 | 11/2003 | Lupton et al. | |
| 6,719,034 B2 | 4/2004 | Heck et al. | |
| 6,725,522 B1 | 4/2004 | Ivanov et al. | |
| 6,759,143 B2 | 7/2004 | Oda et al. | |
| 6,793,784 B1 | 9/2004 | Bach et al. | |
| 6,799,627 B2 | 10/2004 | Ray et al. | |
| 6,856,444 B2 | 2/2005 | Ingalls et al. | |
| 6,896,033 B2 | 5/2005 | Yamamura et al. | |
| 6,908,588 B2 | 6/2005 | Wilhartitz et al. | |
| 6,921,470 B2 | 7/2005 | Michaluk | |
| 6,955,852 B2 | 10/2005 | Ivanov | |
| 6,988,306 B2 | 1/2006 | Koenigsmann et al. | |
| 7,141,812 B2 | 11/2006 | Appleby et al. | |
| 7,146,703 B2 | 12/2006 | Ivanov | |
| 7,300,617 B2 | 11/2007 | Gerling | |
| 7,372,610 B2 | 5/2008 | Burdis et al. | |
| 7,563,488 B2 | 7/2009 | De Bosscher et al. | |
| 7,593,154 B2 | 9/2009 | Burdis et al. | |
| 7,767,043 B2 | 8/2010 | Segal et al. | |
| 7,824,528 B2 | 11/2010 | Dellaert et al. | |
| 7,830,585 B2 | 11/2010 | Widjaja et al. | |
| 8,043,488 B2 | 10/2011 | De Bosscher | |
| 8,092,657 B2 | 1/2012 | De Bosscher et al. | |
| 2004/0016635 A1 | 1/2004 | Ford et al. | |
| 2004/0020769 A1 | 2/2004 | Ivannov et al. | |
| 2004/0186810 A1 | 9/2004 | Michaluk et al. | |
| 2005/0051606 A1 | 3/2005 | Perrot et al. | |
| 2005/0279630 A1 | 12/2005 | Fonte | |
| 2006/0207740 A1 | 9/2006 | Weigert et al. | |
| 2006/0249373 A1 | 11/2006 | Vanderstraeten | |
| 2007/0062803 A1 | 3/2007 | Purdy et al. | |
| 2007/0074969 A1 | 4/2007 | Simpson et al. | |
| 2007/0086909 A1 | 4/2007 | Abenthung et al. | |
| 2007/0137999 A1 | 6/2007 | Delrue et al. | |
| 2007/0269330 A1 | 11/2007 | Ziani et al. | |
| 2008/0041720 A1 | 2/2008 | Kim et al. | |
| 2008/0087541 A1 | 4/2008 | Dellaert et al. | |
| 2008/0105543 A1 | 5/2008 | Dellaert et al. | |
| 2008/0110746 A1 | 5/2008 | Kardokus et al. | |
| 2008/0112878 A1 | 5/2008 | Kardokus et al. | |
| 2008/0149477 A1 | 6/2008 | Lo et al. | |
| 2008/0202925 A1 | 8/2008 | Dellaert et al. | |
| 2008/0236738 A1 | 10/2008 | Lo et al. | |
| 2009/0045050 A1 | 2/2009 | Kuniya et al. | |
| 2009/0045051 A1 | 2/2009 | Ferrasse et al. | |
| 2009/0078570 A1 | 3/2009 | Yi et al. | |
| 2009/0139862 A1 | 6/2009 | De Bosscher | |
| 2009/0173626 A1 | 7/2009 | Duckham et al. | |
| 2009/0183983 A1 | 7/2009 | Van De Putte et al. | |
| 2009/0208280 A1 | 8/2009 | Van De Putte et al. | |
| 2009/0250337 A1 | 10/2009 | Simons et al. | |
| 2009/0277788 A1 | 11/2009 | Oda et al. | |
| 2010/0178525 A1 | 7/2010 | Campbell | |
| 2010/0326823 A1 | 12/2010 | Todoko et al. | |
| 2011/0089030 A1 | 4/2011 | Juliano et al. | |
| 2011/0100809 A1 | 5/2011 | Delrue et al. | |

FOREIGN PATENT DOCUMENTS

| | | | |
|---|---|---|---|
| DE | 4216870 A1 | 1/1993 | |
| EP | 0092477 A1 | 10/1983 | |
| EP | 918351 A1 | 5/1999 | |
| EP | 969238 A1 | 1/2000 | |
| EP | 1063679 A1 | 12/2000 | |
| EP | 1186682 A2 | 3/2002 | |
| EP | 1589129 A1 | 10/2005 | |
| EP | 1652564 A1 | 5/2006 | |
| EP | 1652565 A1 | 5/2006 | |
| EP | 1813695 A1 | 8/2007 | |
| EP | 1826292 A1 | 8/2007 | |
| EP | 2287356 A1 | 2/2011 | |
| GB | 199600210.0 | 1/1996 | |
| JP | 1212759 A | 8/1989 | |
| JP | 2190470 A | 7/1990 | |
| JP | 2-200775 A * | 8/1990 | C23C 14/34 |
| JP | 2311394 A | 12/1990 | |
| JP | 2001059170 A | 3/2001 | |
| JP | 2007009896 A | 1/2007 | |
| JP | 2010018883 A | 1/2010 | |
| JP | 2010111943 A | 5/2010 | |
| KR | 100674005 B1 | 1/2007 | |
| TW | 200914637 A | 4/2009 | |
| WO | WO-1999054911 A1 | 10/1999 | |
| WO | WO-2004043631 A1 | 5/2004 | |
| WO | WO-2004085902 A1 | 10/2004 | |
| WO | WO-2005005682 A1 | 1/2005 | |
| WO | WO-2005026408 A2 | 3/2005 | |
| WO | WO-2005090631 A1 | 9/2005 | |
| WO | WO-2005098898 A1 | 10/2005 | |
| WO | WO-2005105274 A1 | 11/2005 | |
| WO | WO-2006008197 A1 | 1/2006 | |
| WO | WO-2006040275 A1 | 4/2006 | |
| WO | WO-2006042808 A1 | 4/2006 | |
| WO | WO-2006071596 A1 | 7/2006 | |
| WO | WO-2006098781 A2 | 9/2006 | |
| WO | WO-2006110754 A2 | 10/2006 | |
| WO | WO-2007003488 A1 | 1/2007 | |
| WO | WO-2007141173 A1 | 12/2007 | |
| WO | WO-2007141174 A1 | 12/2007 | |
| WO | WO-2007147757 A1 | 12/2007 | |
| WO | WO-2009035933 A2 | 3/2009 | |
| WO | WO-2009036910 A1 | 3/2009 | |
| WO | WO-2009100985 A1 | 8/2009 | |
| WO | WO-2009109435 A1 | 9/2009 | |
| WO | WO-2009138348 A1 | 11/2009 | |
| WO | WO-2010003947 A1 | 1/2010 | |
| WO | WO-2010036801 A2 | 4/2010 | |
| WO | WO-2011045304 A1 | 4/2011 | |

OTHER PUBLICATIONS

Adams John et al: Containerless processing and characterization of high purity aluminum alloys. Proceedings of the International Conference on Processing Materials Properties, Jan. 1, 1993, pp. 905-908, XP000614504.

(56) References Cited

OTHER PUBLICATIONS

International Search Report and Written Opinion dated Sep. 19, 2012 in International Application No. PCT/US2012/044399, 13 pages.

* cited by examiner

SPUTTERING TARGET

CROSS REFERENCE TO RELATED APPLICATIONS

This application is a U.S. national stage application of International Patent Application Serial No. PCT/US12/044399, filed Jun. 27, 2012, which claims the benefit of and priority to U.S. Provisional Patent Application Ser. No. 61/501,605, filed Jun. 27, 2011; the entire content of both applications are incorporated herein by reference.

FIELD OF THE INVENTION

This application relates generally to casting and, more specifically, to casting of reactive materials, as well as to tubular reactive material targets thus obtained.

BACKGROUND OF THE INVENTION

Thin film deposition of lithium is typically done by evaporation. Lithium physical vapor deposition ("PVD") targets for e.g., sputtering equipment are not commonly available; and lithium coatings formed by sputtering processes employ planar targets, not rotary targets (also referred to as tubular targets). Unlike planar targets that are pressed or forged, rotary targets are formed by casting, a method that allows control of grain size, including the uniformity of the grains. Providing a uniform grain size distribution, on the other hand, is difficult when one presses lithium to form a target. They also are limited to use in certain types of deposition equipment.

Rotary targets provide several benefits in comparison to planar targets, including longer life, higher target utilization, and improved ability to withstand reactive sputtering environments via the self-cleaning feature of rotary targets. In particular, planar targets have a stationary erosion pattern on the surface. Near the edges of the erosion pattern (race track), material is re-deposited, typically as an insulating oxide. This re-deposition encroaches on the erosion pattern and makes the erosion pattern narrower, i.e., the amount of material available for deposition decreases. A similar erosion pattern exists on a rotary target, but because the target is rotating, new material is moved into the erosion pattern. In other words, the redeposited area of a rotary target is moved into the erosion zone before it gets too thick and is "cleaned."

Moreover, in the lithium battery industry, a strong demand exists to replace evaporation of lithium with sputtering. Evaporation produces a highly uniform deposited film. In order to achieve such films, however, substrates have to be arranged in a near parabolic configuration with respect to the evaporation source. Accordingly, unlike sputtering, evaporation is not well suited for the coating of webs and panels.

SUMMARY OF THE INVENTION

Some embodiments of the present invention provide good methods and systems for casting reactive materials for manufacturing reactive targets, as well as good reactive material targets thus obtained, such as e.g., tubular targets although embodiments are not limited thereto and also reactive material planar targets can be produced.

Methods for casting a reactive material target include casting a reactive material rotary target including casting, e.g., lithium in a vacuum around a stainless steel mandrel. At least some embodiments of the present invention therefore result in the ability to sputter a reactive material such as pure lithium from a rotary cathode providing the benefit of enabling the sputtering of reactive materials such as lithium or cerium in combination with the benefits of using a rotary cathode.

It is an advantage of embodiments of the present invention that planar as well as tubular targets can be made, e.g., lithium targets, having a substantially uniform grain size distribution.

The above objective may be accomplished by a method and device according to some embodiments of the present invention.

In an aspect, embodiments of the invention feature a method for casting a reactive material PVD target, e.g., a tubular reactive material PVD target, although not being limited thereto. The method comprises the steps of (i) providing a mold defining an opening, the mold having a closed bottom portion; (ii) placing a reactive material ingot into a reservoir proximate the mold; (iii) forming a vacuum or inert atmosphere and melting the reactive material in the reservoir; (iv) heating the mold to above a casting temperature and forming a vacuum or inert atmosphere therein; (v) introducing molten reactive material from the reservoir into the opening; and (vi) cooling the mold to form the PVD target. According to embodiments of the present invention, the steps of providing a mold defining an opening and of placing a reactive material into a reservoir proximate the mold may be performed prior to sealing the reservoir and the portion of the mold into which the target material is introduced. The sealing may be performed before forming a vacuum or inert atmosphere and melting the reactive material in the reservoir. The latter results in the advantage of embodiments of the present invention avoiding that reactive material is exposed to atmosphere or is exposed in its molten reactive state to atmosphere. Before or during sealing, the reservoir and the mold may be assembled together so as to form a sealable volume. Introducing molten reactive material from the reservoir into the opening may comprise allowing molten reactive material to flow, e.g., under gravity, into the mold. Placing a reactive material ingot into a reservoir may comprise placing a reactive material ingot under controlled atmosphere into the reservoir. The reservoir and the mold may be part of the same vessel. Providing a mold may comprise providing a mold including an outer mold shell and a mandrel disposed within the outer mold shell, the outer mold shell and the mandrel defining a cylindrical annular opening therebetween, the mandrel having an inner wall defining a core zone. The formed target may be a tubular PVD target.

Embodiments of the present invention reference may include tubular targets, including a rotary target or a rotatable target. The shape of such a target may for example be cylindrical.

One or more of the following features may be included. Heating the mold may include heating the inner wall and/or the outer mold shell. The outer mold shell may be heated via thermal radiation from the inner wall. Heating may be performed using any suitable means such as using conductive heating, radiative heating, etc.

Cooling the mold may include directing a fluidic cooling medium toward the inner wall from the core zone, e.g., spraying the fluidic cooling medium through a showerhead. Alternatively, the fluidic cooling medium also could be inserted in any other manner so that it flows over the inner wall from the core zone. An outer surface of a mold for casting a planar target alternatively may form an inner wall of the core zone. The fluidic cooling medium may include or consist essentially of a fluid such as water, aqueous solutions, and/or oil-based compositions. In case of spraying, the showerhead may be mounted at a distal end of a heater and the heater may be configured for insertion into the core zone. In one embodiment, the heater may be extracted from the core zone and the fluidic cooling medium sprayed through the showerhead simultaneously. Advantageously, in some embodiments of the present invention, an efficient manner for heating and cooling may be applied.

Cooling the mold may include spraying a fluidic cooling medium toward an outer surface of the mold, e.g., the outer mold shell. Directing the fluidic cooling medium may include spraying the fluidic cooling medium through a showerhead. The fluidic cooling medium may be a fluid including or consisting essentially of water, aqueous solutions, and/or oil-based compositions. Alternatively, cooling the outer mold shell also may be applied by applying fluidic cooling medium any other suitable way and let it flow over the outer mold shell.

The mold may be oriented vertically and at least one of the inner wall and the outer mold shell may be cooled from bottom to top. Cooling of the mold may include cooling the outer mold shell and the inner wall of the mandrel simultaneously. The mold may be agitated after the molten reactive material is introduced into the mold and before the mold is cooled. Agitation may include vibration, use of repetitive or non-repetitive movement, etc. The outer wall mold shell may be destructively removed from the tubular PVD target. The reactive material may be lithium or a lithium-based alloy.

In another aspect, embodiments of the invention include a tubular or planar reactive material PVD target that may be cast according to any of the methods described above. Such a tubular or planar reactive material PVD target may be a lithium or lithium containing target, although embodiments of the present invention are not limited thereto and other reactive materials targets also can be formed using the casting technique, such as for example sodium, potassium, magnesium or tellurium.

In yet another aspect, embodiments of the invention may include a tubular or planar PVD target having a basic structure; and a cast reactive material layer disposed over the basic structure. The basic structure may be a mandrel having an inner wall defining a core zone and the cast reactive material layer may be disposed over an outer wall of the mandrel and the mandrel and cast lithium layer define a tubular structure. One or more of the following features may be included. The reactive material layer may be present in its non-reacted form. The cast reactive material layer may be a lithium layer. The cast reactive material layer may comprise less than 1 volume percentage of void spaces.

The mandrel may include at least one of steel and stainless steel. The cast lithium layer may have grains with an average grain size with a diameter of at least about 3 mm.

In one aspect, embodiments of the present invention also relate to a system for performing a method as described above. Such a system may include a holder for holding a mold defining an opening therebetween, the mold having a closed bottom portion, a reservoir configured with respect to the holder such that the reservoir is proximate the mold, a vacuum generating means for generating a vacuum in the reservoir and in the mold, a heating means for melting reactive material in the reservoir and for heating the mold above a predetermined casting temperature and a cooling means for cooling the mold to form a tubular or planar PVD target. The holder, the reservoir, the vacuum generating means, the heating means, and/or the cooling means may comprise any of the features as described in the first aspect or may comprise elements having the functionality of one or more of the method steps described in the first aspect. For example, the mold may include an outer mold shell and a mandrel disposed within the outer mold shell, the outer mold shell and the mandrel defining a cylindrical annular opening therebetween.

In yet another aspect, embodiments of the present invention relate to a mold for use in the manufacturing of a tubular reactive material PVD target. The mold may include an outer mold shell and a mandrel disposed within the outer model shell, and the outer mold shell and the mandrel may be defining a cylindrical annular opening therebetween. The mold also has a closed bottom portion and an inner wall of the mandrel defining a hollow zone.

Particular and preferred embodiments of the invention are set out in the accompanying independent and dependent claims. Features from the dependent claims may be combined with features of the independent claims and with features of other dependent claims as appropriate and not merely as explicitly set out in the claims.

BRIEF DESCRIPTION OF THE DRAWINGS

The following drawings are not necessarily to scale, emphasis instead being placed generally upon illustrating the principles of embodiments of the invention. The foregoing and other features and advantages of embodiments of the present invention, as well as the invention itself, will be more fully understood from the following description of exemplary and preferred embodiments, when read together with the accompanying drawings, in which.

Figure 1:
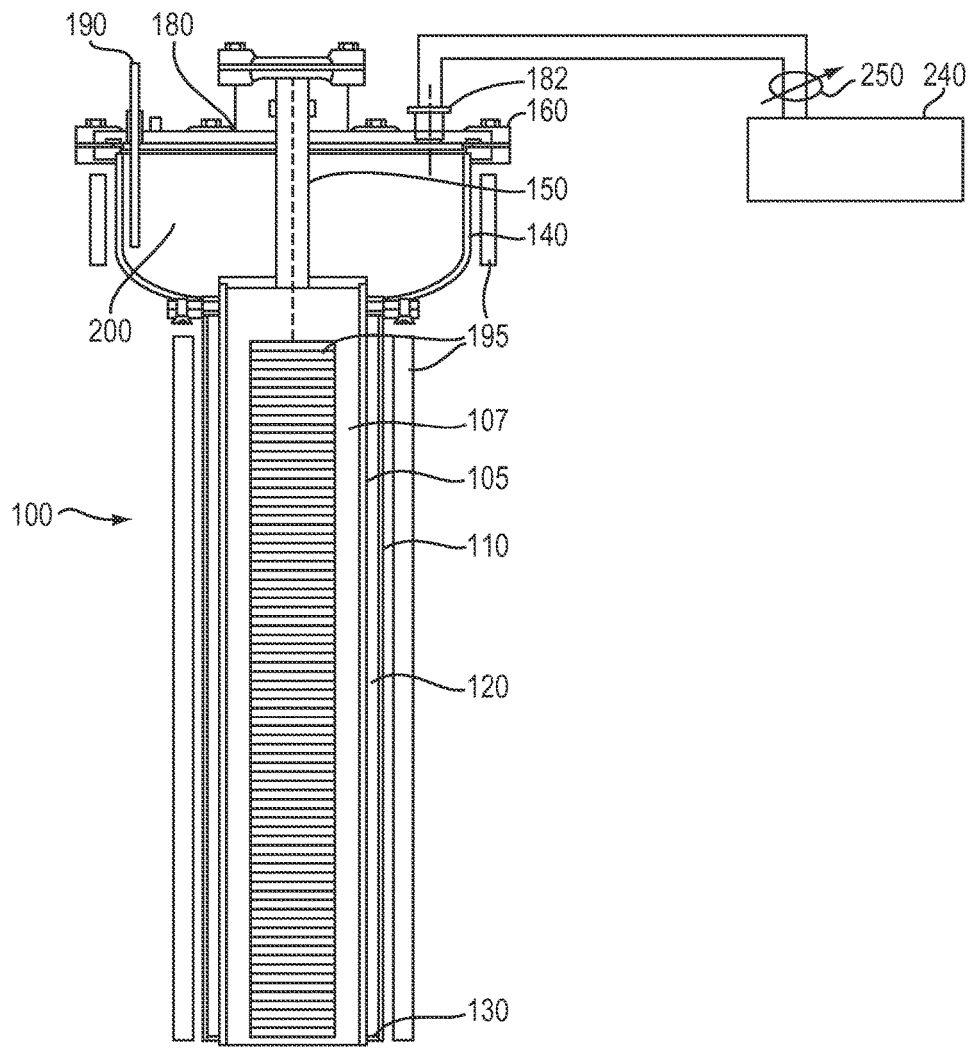
FIGS. 1-3 are schematic diagrams illustrating an apparatus for casting a reactive material PVD target in accordance with an embodiment of the invention.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of embodiments of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising," used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the embodiments of the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification do not necessarily all refer to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed embodiments of the invention require more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to an ingot reference is made to a material that can be used as a source material for melting in a reservoir. Examples of possible ingot materials may be threads, powder, pieces, grains, rope, bar, pucks, shots etc.; embodiments of the present invention are not limited thereby.

Reactive material used in embodiments of the present invention may include materials having reactive properties, such as for example lithium, magnesium, cerium, sodium, potassium, etc. This does not only relate to elemental materials based on elements in Mendeleev's table that are considered to have reactive materials, but also to alloys or compounds comprising such elements in their non-reacted form. According to at least some embodiments of the present invention, the reactive materials advantageously are in their non-reacted or pure form.

Figure 2:
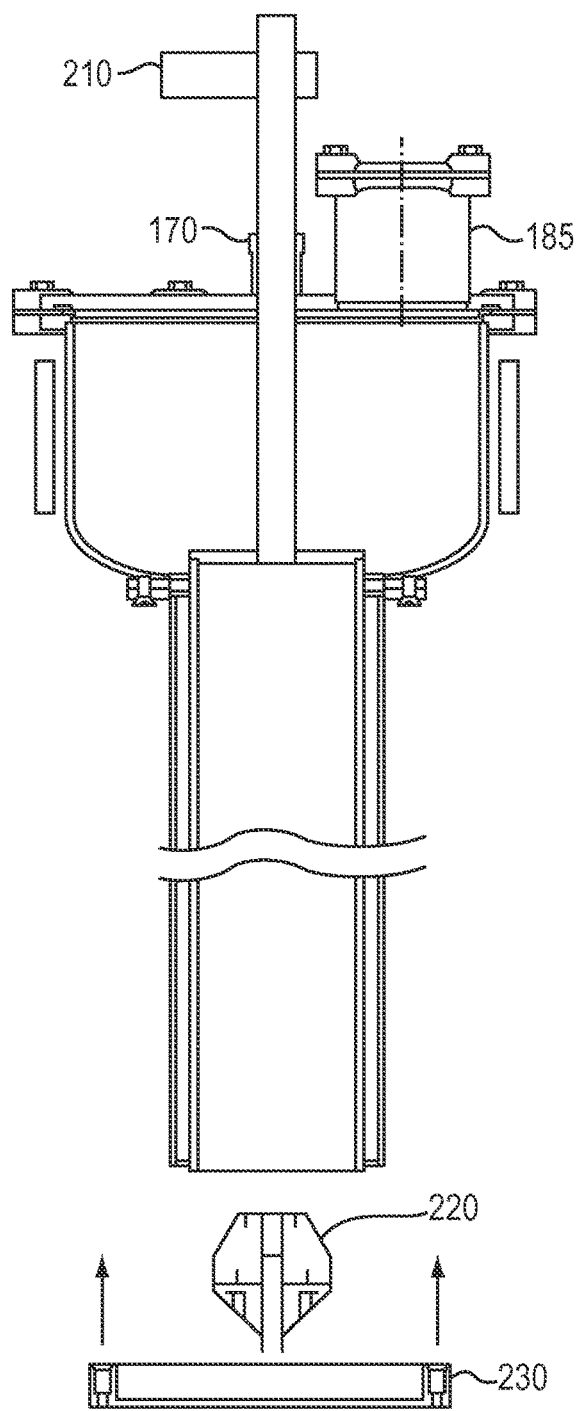

In a first aspect, embodiments of the present invention relate to methods for casting tubular targets of reactive materials, as described above. It will be understood that the method can also be applied for planar targets, based on a different mold shape, e.g., a mold having a plurality of upstanding walls forming a box shaped mold having an elongated opening for providing the molten reactive material between the upstanding walls of the box. One of the walls thereby may form a basic structure. Returning now to the particular example of a method for casting a tubular reactive material target, standard and optional features of such methods will further be described with reference to FIGS. 1 and 2, embodiments of the present invention not being limited thereto. Referring to FIGS. 1 and 2, in an embodiment of the invention, a vessel 100 may include a central element, referred to as mandrel 105 (also referred to as a core herein) surrounded by an outer mold shell 110. According to embodiments of the present invention, the mandrel advantageously is a hollow element, such that an inner surface of the mandrel 105 may define a core zone 107 therein. Both the mandrel and the outer mold shell may be made of any suitable material, such as e.g., stainless steel. The material used may be selected such that the mandrel and the outer mold shell are inert to the reactive material of which the sputter target will be made. In some embodiments, the outer mold shell may be steel. Further, the mandrel may be titanium or another material that the reactive material, e.g., lithium, wets. The outer mold shell may be any other material that will not contaminate the reactive material, e.g., lithium, and that can withstand the heat of casting. To promote adhesion of the reactive material to the core 105, the core may be bare stainless steel, stainless steel with a bead blasted surface, or stainless steel with a knurl finish. Additional means to promote adhesion of the reactive material to the core, may be application of a layer, such as nickel plating to the OD of the stainless steel core. Other stable cores and surface finishes and features are contemplated (e.g., grooves, splines, etc.) The mandrel and the outer mold shell may define a gap 120 therebetween, in the form of, e.g., a cylindrical annular opening. The cylindrical annular opening typically has dimensions equal to the dimensions of the product to be cast in the mold. Typical dimensions may be as follows: mandrel outer diameter—133 mm; outer mold shell inner diameter—163-174 mm or greater, embodiments of the present invention not being limited thereto.

The mold has a closed bottom portion, with a plate 130 bridging the mandrel 105 and the outer mold shell 110, thereby sealing a bottom portion of the gap 120. A top portion of the outer mold shell defines a funnel which may have a larger diameter than a lower portion of the outer mold shell, thereby forming a reservoir 140. The mandrel 105 itself or an extension tube 150 attached to the mandrel extends upward beyond the reservoir 140. The capacity of the reservoir may be sufficiently large, e.g., be equal to final cast material volume+20%+extra room, since the starting material may not be completely compact. For example, the starting material may be a rope or bar coiled up or a number of pucks or shot, or any other type of ingot that can be used. The purpose of the extension tube 150 is to provide venting, so that when the coolers spray fluidic cooling medium as described below, vapors may escape. The extension tube 150 may also be of sufficient diameter to facilitate the placement of the ID heater and ID cooler and to allow the heater and coolers to be withdrawn vertically from the inside of the mold. The reservoir 140 may alternatively be a separate component attached to the top portion of the outer mold shell 110.

In the example shown, a top portion of the reservoir 140 includes a first flange 160 for attachment of a cover 180. A second flange 170 is disposed around the mandrel 105. In an alternative embodiment, in which an extension tube 150 is attached to the mandrel, a second flange 170 is disposed around the extension tube 150. The second flange 170 is disposed around the mandrel/extension tube near the same level as the first flange 160 covering the reservoir.

A cover 180 may be configured for placement over the reservoir by being adapted to be bolted onto the first and second flanges 160, 170. Disposed within the cover typically may be pumping ports 182, gas ports, instrumentation ports, and viewing ports 185. A gas tube 190 extends through the cover 180, and is configured for optional introduction of gas into the reservoir 140.

Heaters 195 are configured to separately heat the reservoir 140, the outer mold shell 110, and an inner surface of the mandrel 105. The heaters may be any suitable heating means, such as for example electric resistance heaters, gas heaters, a combination of both, conductive heaters, etc. One or more of the heaters may be a tubular heating element, such as a WATROD, part number RDN134JlOS, manufactured by Watlow Electric Manufacturing Company, based in St. Louis, Mo. At least one of the heaters may configured for movement relative to the mold for heating the mold. In some embodiments, the heater is configured for insertion into the core zone of the mandrel. The inserted heater may heat an inner wall of the mandrel; the outer mold shell may be heated by thermal radiation from the inner wall or a separate heater. The inserted heater may be, for example, a tubular resistance heating element arranged in a coil around a reflective mandrel. The separate heater for the outer mold may be a tubular heating element bent in a coil surrounding the outer diameter of the outer mold shell.

An agitator 210 such as a rotary actuator or vibratory source may be configured to agitate the mold mandrel and outer mold shell, preferably after the molten reactive target material is introduced and before the outer mold shell and inner wall of the mandrel are cooled. Any type of agitator providing a repetitive or non-repetitive movement and allowing to induce compacting of the material casted, may be used. A suitable agitator is a ductile iron low-impact air-powered vibrator, side inlet, available as part number 5807K71 from McMaster-Carr, based in Robbinsville, N.J.

Figure 3:
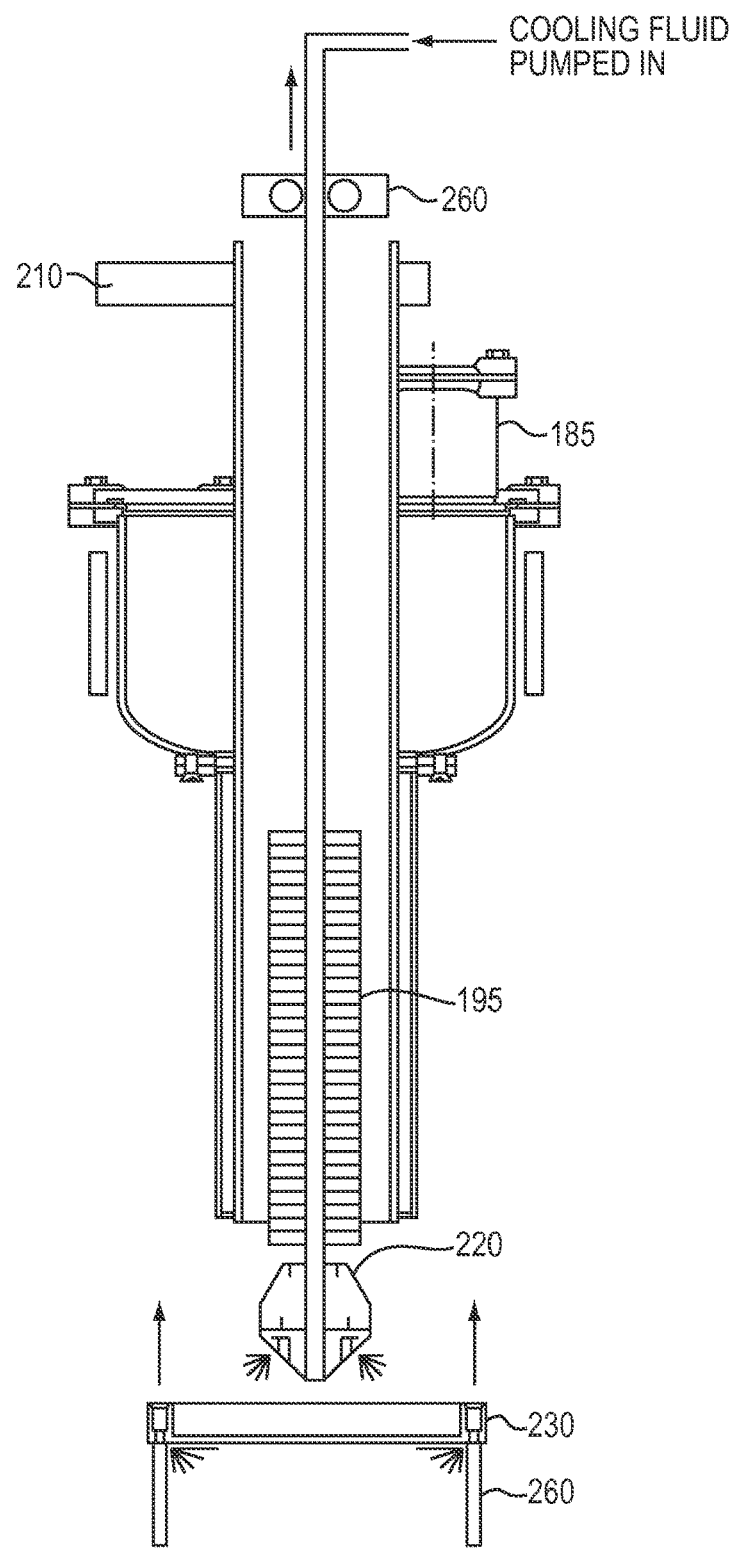

Referring to FIG. 2 and also FIG. 3, a first cooler 220 may be configured for insertion into the mandrel for cooling the inner surface of the mandrel. In some embodiments, the first cooler may be configured for movement relative to the mold portion of the vessel. The first cooler may be mounted at a distal end of a heater. The first cooler may be, for example, a fluidic cooling system, such as a showerhead. The showerhead may be configured to dispense a fluidic cooling medium, such as water, an aqueous solution, and/or oil-based compositions.

A second cooler 230 may be configured for cooling the outer mold shell 110. In some embodiments, the second cooler may be configured for movement relative to the outer mold shell 110. The first and the second coolers may be configured to be moved simultaneously or in a coordinated fashion. The second cooler may be, for example, a fluidic cooling system, such as a showerhead. The configuration of this showerhead may be a sprinkler wand bent into a circle to fit around the outer mold shell. The showerhead may be configured to dispense a fluidic cooling medium, such as water, an aqueous solution, and/or oil-based compositions.

Safety measures may be instituted with both coolers, as reactive materials such as lithium burn in the presence of water. A lift mechanism 260 may be configured for moving each of the first and second coolers. The lift mechanism may for example make use of a servo motor, a linear slide and showerhead mounting hardware. The servo motor accurately controls the rate at which the coolers move relative to the mold. The inner and outer coolers can each have their own lift mechanisms.

In use, a pre-load of a reactive material, e.g., lithium ingots 200, is placed into the reservoir 140, preferably at room temperature. The amount of the reactive material placed in the reservoir is preferably sufficient to fill the mold (i.e., the circular annular opening) to the height of the finished rotary target with an additional 20% to compensate for compacting of material.

For smaller targets, the entire mold, as well as the reactive material in a hermetically sealed package may be positioned in a conditioned atmosphere. The mold and the reactive material may for example be placed in a glove box. The glove box is conditioned to relative humidity less than 2%. The reactive material is removed from the package and placed in the reservoir. The cover is placed on the reservoir and the reservoir is sealed. The mold is removed from the glove box. For larger targets, a glove box type apparatus is placed on top of the reservoir such that the inside of the mold can be conditioned to less than 2% relative humidity. The reactive material is placed in the reservoir and the cover is closed. After the reactive material is placed, the reservoir and the mold portion into which the material is to be casted may be a sealed assembly. The cover 180 is bolted onto the flanges 160, 170 to form a vacuum-tight seal.

A vacuum is formed in the reservoir 140 by a vacuum pump 240 connected to the pumping port 182. The vessel is pumped to less than 1 torr. A suitable pump is model Leybold D30 manufactured by Oerlikon Leybold Vacuum GmbH, based in Koeln, Germany. A gas may be introduced via the gas tube 190 to flush out the reservoir 140. The gas may be, for example, a forming gas that may reduce oxide that may have formed on the lithium 200. A suitable forming gas is dichlorodifluoromethane (FREON 12). The forming gas may be mixed with argon, e.g., 10% forming gas and 90% argon. More advantageously, operation also can be performed under hard vacuum, such as for example at a pressure near 30" Hg. When used, a partial vacuum in a range of between about 10" mercury and about 20" mercury may be maintained in the reservoir and the mold using a variable orifice valve 250.

A vacuum is also formed in the mold portion of the vessel including the mandrel 105 and the outer mold shell 110, for example with the same pump 240 used to form the vacuum in the reservoir 140. A gas, such as forming gas, may be introduced into the mold portion of the vessel, as well.

The heaters 195 may be turned on and controlled to attain a temperature above the melting point of the reactive material, e.g., lithium, i.e., above 180° C., e.g., to about 300° C. In an exemplary process, the heater for the outer mold shell and the heater for the inner wall of the mandrel are set to 300° C., and the reservoir is preheated to 120° C. Once the outer and inner mold shells attain the set temperature, the reservoir temperature is increased to 300° C.

Preferably, the mandrel is hot before the reactive material enters the cylindrical annular opening, so that the reactive material wets the mandrel. The mold may be heated by heating the inner wall of the mandrel and/or heating the outer mold shell. The outer mold shell may alternatively or additionally be heated via thermal radiation from the inner wall.

The reactive material ingot 200 is thus melted, and the reactive material flows into the gap 130 between the mandrel and the outer mold shell. Agitation or vibration may be performed during casting to promote adhesion of the reactive material to the mandrel and remove any trapped gas bubbles.

The reactive material is then cooled via cooling medium outside the outer mold shell and/or inside the core zone. The cooling medium may be water, an aqueous solution, and/or oil-based compositions, and may be applied (i.e., sprayed) by the first and second coolers. Alternatively, the apparatus may be submerged into the cooling medium. Cooling the mold may include cooling the outer mold shell and the inner wall of the mandrel simultaneously. The mold may be oriented vertically, and the inner wall and/or the outer mold may be cooled from bottom to top. In some embodiments, a heater with a showerhead mounted at a distal end thereof may be extracted from the core zone, while fluidic cooling medium is sprayed through the showerhead. The rate of cooling may be controlled to solidify the reactive material, e.g., lithium, to define a small uniform grain structure having an average size of, e.g., 3-10 mm diameter.

Certain preferred casting parameter ranges are listed in Table 1.

TABLE 1 casting parameters

| Parameter | Maximum | Minimum | Exemplary |
|---|---|---|---|
| Internal pressure | 10" Hg | 20" Hg | 15" Hg |
| Temperature | 480° C. | 200° C. | 300° C. |
| Background vacuum | 10 Torr | 0.1 Torr | .5 Torr |
| Gas flow rate | 15 SUFH | 2 SCFH | 5 SCFH |
| Cooling medium flow | 1.5 gpm | 1 gpm | 12 gpm |
| Average grain size | 10 mm | 0.1 mm | 3 mm |

In some embodiments, heating and cooling of the mold may be provided by separate stations, and the mold assembly may be moved first to the heating station for the inciting and casting of the molten reactive material, and then to the cooling station for the solidification of the cast reactive material. Table 2 describes a typical process sequence, according to one embodiment utilizing separate heating and cooling station.

TABLE 2 exemplary process flow employing cooling and heating stations

Figure 4:
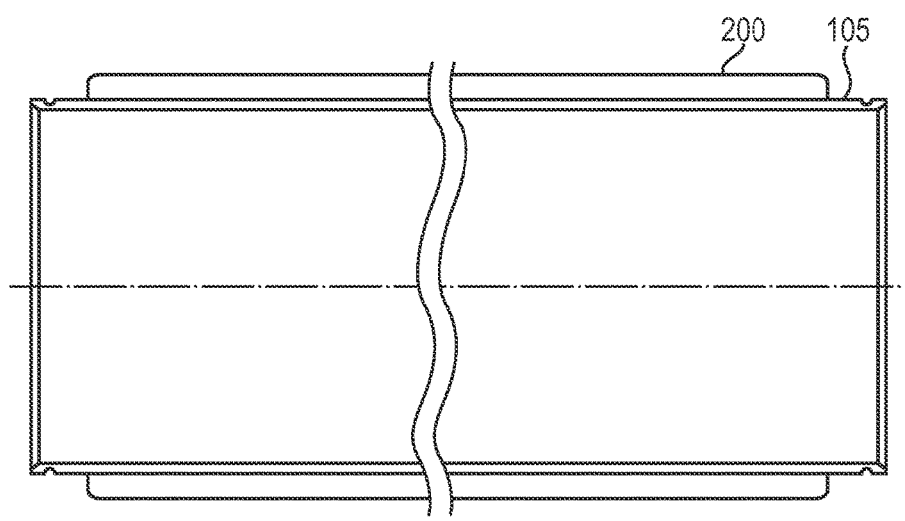
FIG. 4 is a schematic diagram of a tubular reactive material PVD target formed in accordance with an embodiment of the invention.

Place mold assembly, pre-loaded with reactive material, in heating station (a station including a heater, an insulated outer wall, insulated bottom, and insulated cover) and connect vacuum and gas lines
Cycle purge 3 times between vacuum (1 torr) and pressure (5 psi)
Set pressure to 30" Hg via vacuum valve
Set funnel temperature setpoint to 250° F.
Set casting assembly temperature setpoint to 500° F.
Once casting assembly temperature is near setpoint, increase the funnel temperature setpoint to 600° F.
Once at temperature, make sure material is melted
Flow material into mold
Lower mold temperature
Wait for mold temperature to reduce to new setpoint temperature TABLE 2-continued exemplary process flow employing cooling and heating stations Shake, tap or vibrate assembly every 10 minutes
Shut off ID heater and funnel chamber heater
Turn on cooling fluid
Lift heater/showerhead assemblies
Once assembly has cooled to below solidus temperature, turn off cooling fluid
Pressurize unit to 20 psi Referring also to FIG. 4, after the reactive material is cast and cooled, the outer mold shell is destructively removed by, e.g., being cut off with a longitudinal saw or milling cut. Alternatively, the outer mold shell can be removed in a non-destructive manner, so as to be able to re-use the outer mold shell. The reactive material, e.g., lithium 200, remains on the mandrel 105, to form a rotary lithium PVD target. The rotary reactive material PVD target includes the mandrel having an inner wall defining a core zone and a cast lithium layer disposed over an outer wall of the mandrel, with the mandrel and cast lithium layer defining a tubular structure. The cast layer may be finish machined to final length and diameter requirements.

In one aspect, the embodiments of the present invention also relate to a system for performing a method as described above. Such a system may include a holder fir holding a mold (e.g., a mold for a planar target or a mold for a tubular target including an outer mold shell and a mandrel disposed within the outer mold shell, the outer mold shell and the mandrel defining a cylindrical annular opening therebetween), the mold having a closed bottom portion. The mold in some embodiments may have an inner wall, e.g., an inner wall of a mandrel, defining a core zone. The system also comprises a reservoir configured with respect to the holder such that the reservoir is proximate the mold, a vacuum generating means for generating a vacuum in the reservoir and in the mold, a heating means for melting reactive material in the reservoir and for heating the mold above a predetermined casting temperature and a cooling means for cooling the mold to form a reactive PVD target. The holder, the reservoir, the vacuum generating means, the heating means, and/or the cooling means may comprise any of the features as described in the first aspect or may comprise elements having the functionality of one or more of the method steps described in the first aspect.

In yet another aspect, the embodiments of the present invention relate to a mold for use in the manufacturing of a reactive material PVD target, e.g., a tubular target. In case the mold is suitable for a tubular target, the mold includes an outer mold shell and a mandrel disposed within the outer model shell, the outer mold shell and the mandrel defining a cylindrical annular opening therebetween. The mold has a closed bottom portion. In case a tubular target is to be made, the mold also comprises an inner wall of the mandrel defining a hollow zone.

Those skilled in the art will readily appreciate that all parameters listed herein are meant to be exemplary and actual parameters depend upon the specific application for which the methods and materials of the embodiments of the present invention are used. It is, therefore, to be understood that the foregoing embodiments are presented by way of example only and that, within the scope of the appended claims and equivalents thereto, the embodiments of the invention may be practiced otherwise than as specifically described. Various materials, geometries, sizes, and interrelationships of elements may be practiced in various combinations and permutations, and all such variants and equivalents are to be considered part of the embodiments of the invention.

Although the detailed illustrative embodiments of the present invention are described with reference to a method for casting a tubular reactive material target and tubular reactive targets thus obtained, embodiments are not limited thereto, and the invention also relates in some embodiments to planar targets. The configuration of the mold is then such that a planar target may be cast, for example, including a closed portion in which the target may be cast, e.g., based on two separated walls; the operation in a vacuum and inert atmosphere and the casting process is similar to that described above, resulting in similar features and advantages. Similarly, whereas the above examples have been written with reference to working in a vacuum, operation in an inert atmosphere is also possible.

What is claimed is:

1. A method for casting a reactive material PVD target, the method comprising the steps of:
    providing a mold defining an opening, the mold having a closed bottom portion, and a mandrel surrounded by an outer mold shell, the mandrel being hollow and thus having an inner wall;
    placing a reactive material ingot into a reservoir assembled with the mold so as to be enclosed and sealed, the reservoir located above the mold so that molten reactive material to be cast into the mold flows into a top portion of the mold from above, and the reservoir being directly connected and sealed to a top portion of the mold;
    forming a vacuum or inert atmosphere and melting the reactive material ingot in the reservoir;
    heating the mold to above a casting temperature and forming a vacuum or inert atmosphere therein;
    introducing molten reactive material from the reservoir into the opening of the mold; and
    cooling the mold to form the reactive material PVD target.

2. The method of claim 1, wherein the target comprises a tubular reactive material PVD target, and wherein providing the mold comprises providing a mold including an outer mold shell and a mandrel disposed within the outer mold shell, the outer mold shell and the mandrel defining a cylindrical annular opening therebetween, the mandrel having an inner wall defining a core zone.

3. The method of claim 1, wherein heating the mold comprises heating the inner wall.

4. The method of claim 3, wherein the mold is oriented vertically and at least one of the inner wall and the outer mold shell is cooled from bottom to top.

5. The method of claim 1, wherein heating the mold comprises heating the outer mold shell.

6. The method of claim 1, wherein heating the outer mold shell comprises heating the outer mold shell via thermal radiation from the inner wall.

7. The method of claim 1, wherein cooling the mold comprises directing a fluidic cooling medium toward the inner wall from the core zone.

8. The method of claim 7, wherein directing the fluidic cooling medium comprises spraying the fluidic cooling medium through a showerhead.

9. The method of claim 7, wherein the fluidic cooling medium comprises a fluid selected from the group consisting of water, aqueous solutions, and oil-based compositions.

10. The method of claim 7, wherein directing the fluid cooling medium comprises spraying the fluidic cooling medium through a showerhead, the showerhead being mounted at a distal end of a heater and the heater being configured for insertion into the core zone.

11. The method of claim 10, further comprising simultaneously extracting the heater from the core zone and spraying the fluidic cooling medium through the showerhead.

12. The method of claim 1, wherein cooling the mold comprises directing a fluidic cooling medium toward the outer mold shell.

13. The method of claim 1, wherein the cooling of the mold comprises cooling the outer mold shell and the inner wall of the mandrel simultaneously.

14. The method of claim 1, further comprising agitating the mold after the molten reactive material is introduced into the mold and before the mold is cooled.

15. The method of claim 1, the reactive material PVD target being a tubular PVD target, the method further comprising removing the outer wall mold shell from the tubular PVD target.

16. The method of claim 1, wherein the reactive material is selected from the group consisting of lithium and lithium-based alloys.

* * * * *